United States Patent [19]

Hanlon

[11] Patent Number: 4,831,431
[45] Date of Patent: May 16, 1989

[54] CAPACITANCE STABILIZATION

[75] Inventor: Michael M. Hanlon, Monument, Colo.

[73] Assignee: Honeywell Inc., Minneapolis, Minn.

[21] Appl. No.: 846,330

[22] Filed: Mar. 31, 1986

[51] Int. Cl.$^4$ .............................................. H01L 27/02
[52] U.S. Cl. ........................................ 357/51; 357/59; 307/491; 307/303
[58] Field of Search ...................... 357/51, 59 F, 59 G, 357/71; 307/491, 303

[56] References Cited

U.S. PATENT DOCUMENTS 4,475,118 10/1984 Klein et al. ..................... 357/23.6
4,626,881 12/1986 Kishi et al. ..................... 357/23.6

Primary Examiner—Andrew J. James
Assistant Examiner—Mark Prenty
Attorney, Agent, or Firm—W. T. Udseth

[57] ABSTRACT

An integrated circuit using interconnection of opposite plates of multiple capacitors formed therein to stabilize composite capacitor parameters.

8 Claims, 2 Drawing Sheets 4,831,431

CAPACITANCE STABILIZATION

BACKGROUND OF THE INVENTION

The present invention relates to capacitor provision in monolithic integrated circuits, and more particularly, to capacitors in monolithic integrated circuits which must have highly accurate values of capacitance over a desired operating range.

Capacitors have been provided in monolithic integrated circuits, both bipolar and field effect transistor based circuits, for much of the time such circuits have been fabricated. The quality of such capacitors in terms of the consistency of the parameters asscciated therewith at fabrication and in various operating evvironments has steadily improved. Even though capacitors based on pn semiconductor junctions can provide a higher value of capacitance in a given area taken up in a major surface of an integrated circuit, the metal-oxdde-semiconductor (MOS) class of capacitors can be fabricated t have parameters that are far more precisely valued.

Furthermore, ratios of capacitances can be maintained to an even more precise values than can the absolute capacitance value of any of the capacitors involved in the ratio. Thus, circuits that are designed depending on ratios of capacitances of the capacitors involved rather than on the absolute capacitance values of such capccitors can provide analog circuit operation which is very accurate and repeatable. Many analog circuits can be constructed in this fashion including analog-to-digital converters, analog gate and attenuation control circuits, and various kinds of filters.

Capacitors of the MOS capacitor class can be formed in a number of alternative structures but all are essentially "parallel plate" capacitors having a pair of conductive, parallel plates separated by some kind of dielectric material. The lower plate of such a capacitor, i.e. the one closest to the interface between the main body of semiconductor material and the first portion of the dielectric material thereover, may be formed of either doped polycrystalline silicon or metal provided in this dielectric material a short way from such interface. Alternatively, such lower plate may be formed ofaa portion of the semiconductor material body which is electrically isolated by either a pn junction or by dielectric material from other portions of such body.

The upper plate, or the plate located in this covering dielectri material somewhat farther from such interface, will be formed from either metal or doped polycrystalline silicon. The dielectric material separating such plates will typically be silicon dioxide, but possibly this dielectric material will be silicon nitride or a combination of these materials or others.

MOS capacitors have improved markedly in the precision of the values for the parameters thereof which result from fabrication and which occur over ranges of various factors in the operating environments. Nevertheless, such capacitors continue to have some dependence on the operating environment such as varying in capacitance value with temperature and applied voltage. As an example, FIG. 1 shows on a normalized basis the variation in capacitance with applied voltage for a MOS capacitor having each plate formed of polycrystalline silicon highly doped with phosphorous. Each plate is separated from the other through use of about 600 Å of silicon dioxide between the plates.

This capacitor, as can be seen from FIG. 1, exhibits a monotonically decreasing, or substantially monotonically decreasing, capacitance value for increasing applied voltage in the selected direction across the capacitor for applying such voltage. The variation in capacitance is on the order of 100 parts per million change in capacitance for a change of 1 volt applied voltage.

The capacitor havingtthe variation shown in FIG. 1 in capacitance with applied voltage is a relatively good capacitor in controlling this parameter. However, advanced circuit designs for achieving extreme accuracy in analog circuit performance require capacitances which exhibit substantially smaller capacitance variation in the operating environment. Furthermore, such capacitors should be able to be fabricated with as few changes as possible from the current processes being used to fabricate them.

SUMMARY OF THE INVENTION

The present invention provides a capacitor formed by connecting the lower plate of one capacitor to the upper plate of another capacitor, and vice versa, to provide a composite capacitor in which unwanted certain parameters variations in one of the underlying capacitors are countered by such variations in the other underlying capacitor to reduce variation of such parameter in the composite capacitor.

DESCRIPTION OF THE PREFERRED EMBODIMENT

For parameter variations in capacitors of the MOS class formed in monolithic integrated circuits which have parameters whichvvary in a substantially monotonic manner, a composite capacitor can be formed which will lead to a reduction in the variation of such parameters for this compssite. The composite capacitor arrangement can be achieved by the use of at least two underlying capacitors in which instance the lower plate of one is electrically connected to the upper plate of the other, and the lower plate of the other is connected to the upper plate of the first. In such an arrangement, the variation in parameter for one of these underlying capacitors will in effect be balanced against that of the other to reduce the total variation of such parameter in the composite capacitor.

Typically in the case of the use of two underlying capacitors, each of these capacitors would provide approximately half of the capacitance desired for the composite capacitor. If more interconnected underlying capacitors are used to form a composite capacitor, the fraction of capacitance provided by each would be typically reduced in proportion to their respective plate areas. In this way, approximately the same amount of variation in oee underlying capacitor would be used to counter or offset the amount of variation occurring in another.

Figure 2A:
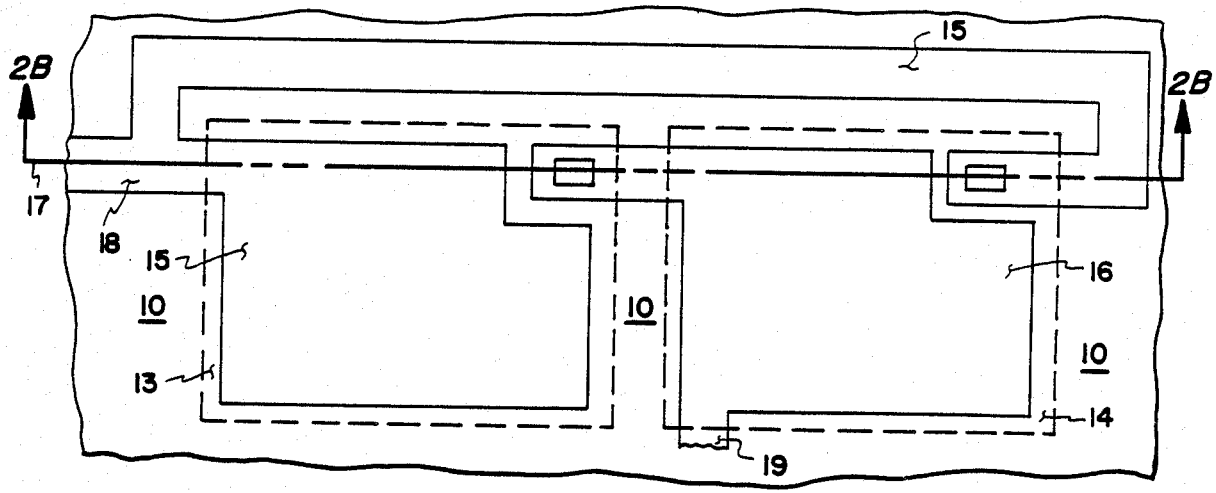
FIGS. 2A and 2B show one embodiment of the present invention.
Figure 2B:
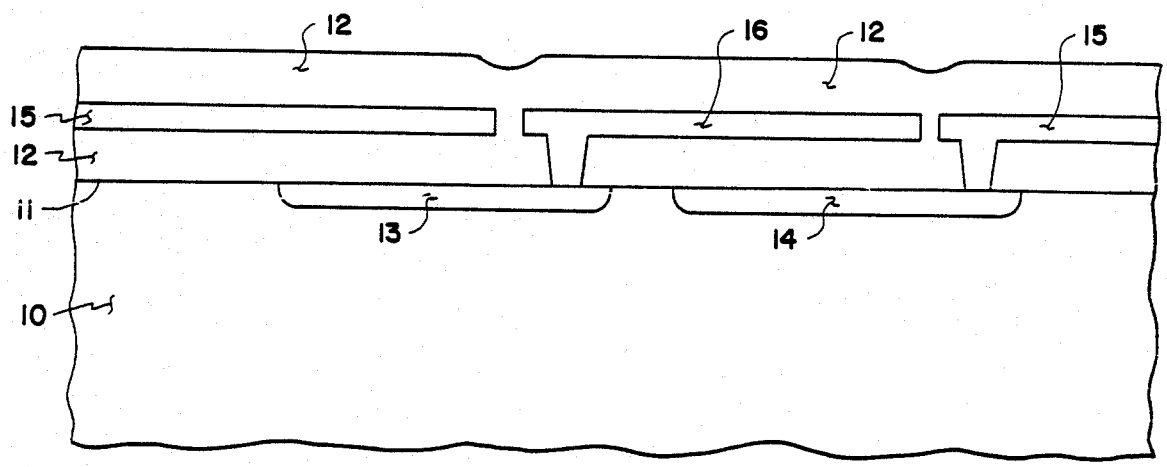

Consider, as examples, the two capacitors interconnected to provide a composite capacitor having the structures shown in FIGS. 2 and 3. FIG. 2B shows a silicon substrate, 10, doped by donor or acceptor impurities as desired to yield a desired resistivity based on the device needs in other parts of the integrated circuit. Substrate 10 may be the main semiconductor body or it might be an epitaxial layer formed on the main semiconductor body. Substrate 10 has a major surface, 11, upon which is provided an insulating structure containing interconnection network portions, capacitor plates, and perhaps other structures.

Two lower plate regions, 13 and 14, of an opposite conductivity type from the conductivity type chosen for substrate 10 are provided intersecting said major surface 11. These regions are highly doped to provide a conductivity type opposite that of substrate 10 with as great a conductivity as practical to reduce parasitic resistance associated with the capacitors, this doping typically exceeding $10^{18}$ atoms per cm$^3$. A portion of the insulating structure, 12, is provided on plate regions 13 and 14 which is of silicon dioxide.

The two upper plates for the capacitors, 15 and 16, farther from major surface 11 are formed of metal which is aluminum alloyed with four percent copper over titanium-tungsten. Where the eetal extends through vias in the insulating layer to electrically contact regions 13 and 14 there is provided a palladium silicide transition region between the titanium-tungsten layer under the aluminum and the silicon substrate portions in plates 13 and 14. The distance between lower plate 13 and upper plate 15, and between lower plate 14 and upper plate 16, is typically 600 Å provided by insulating structure portion 12 to give a capacitance on the order of $5 \times 10^{-4}$ pf/cm$^2$.

FIG. 2A shown above FIG. 2B is a top view through which a section has been taken to provide FIG. 2B. The section is taken along he section line, 17. There is no use of dashed lines to show structures in FIG. 2A which are below portions of the insulating structure as is shown to occur in FIG. 2B. Shown in FIG. 2A are two metal composite capacitor terminating regions, 18 and 19, from which interconnection is made to other parts of the circuitry in the integrated circuit via the interconnection network.

As can be seen, upper plate 15 is formed by the metal interconnection network and is merged with terminating region 18 and the connection made to lower plate 14. Similarly, upper plate 16 is formed from the metal interconnection network and is merged with terminating region 19 and the connection to lower plate 13. Similar designations in each of FIGS. 2A and 2B are used for structures common to each. This arrangement allows, in effect, for the capacitance variation of one capacitor, such as the one formed by plates 13 and 15, with applied voltage of a nature similar to that shown in FIG. 1 to be subtracted from the capacitance variation of the aapacitor formed by plates 14 and 16.

FIG. 3B again shows a silicon substrate, 20, which is doped to provide a desired conductivity type and a desired resistivity based on device needs in other parts of the monolithic integrated circuit. Again the portion of substrate 20 shown in FIG. 3B may be the main semiconductor body or an epitaxial layer formed on the main semiconductor body. Once again, substrate 20 has a major surface, 21, upon which an nnsulating structure is formed containing portions of the interconnectinn network, capacitor plates and possibly other structures.

The insulating structure portions, 22, of this insulating structure are against major surface 21 and contain there within two lower capacitor plates, 23 and 24, formed of polycrystalline silicon ("polysilicon") doped to a high conductivity typically using phosphorous atoms in a concentration exceeding $10^{18}$ atom/cm$^3$. Similarly, there is prvvided two upper capacitor plates, 25 and 26, also formed of polycrystalline similarly doped. Plates 23 and 25, forming one capacitor, and plates 24 and 26, forming another are separated by portions of insulating structure 22 600 Å thick again of silicon dioxide. A capacitance value per unit area is achieved similar to that of the structures shown in FIGS. 2A and 2B.

These upper and lower capacitor plates are interconnected through the metal portion of the electrical interconnection system, and thus the upper plates in this figure are not formed by such metal interconnection system as they were in FIG. 2. One metal interconnection portion, 30, electrically interconnects upper plate 25 with lower plate 24. The other metal interconnection portion, 31, electrically interconnects lower plate 23 with upper plate 26. These metal interconnection portions are formed again by aluminum alloyed with four percent copper on a titanium-tungsten base with platinum silicide below the metal runs through the vias in the silicon dioxide at the polycrystalline plate interconnection points.

Figure 1:
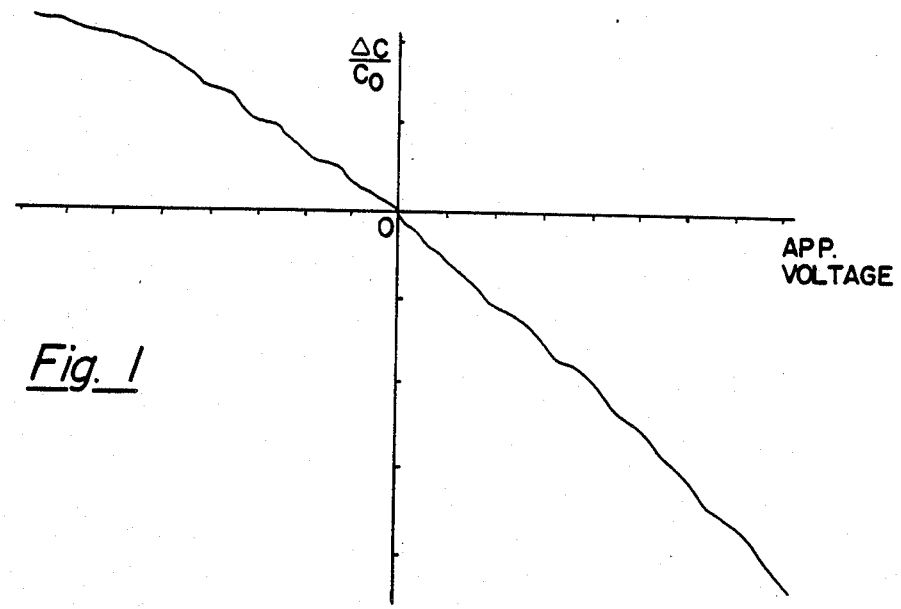
FIG. 1 shows the variation and capacitance of a MOS capacitor with applied voltage.
Figure 3A:
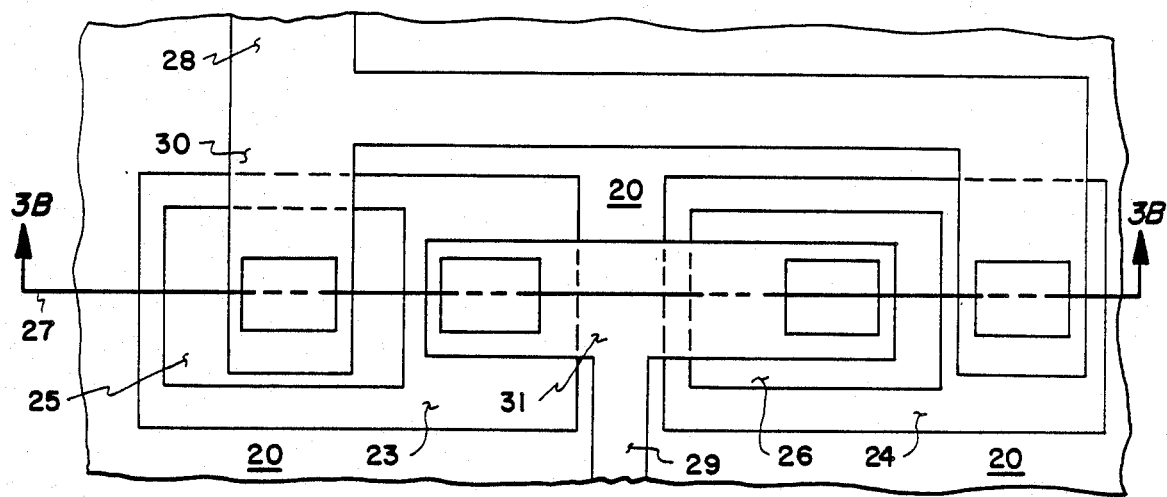
FIGS. 3A and 3B show another embodiment of the present invention.
Figure 3B:
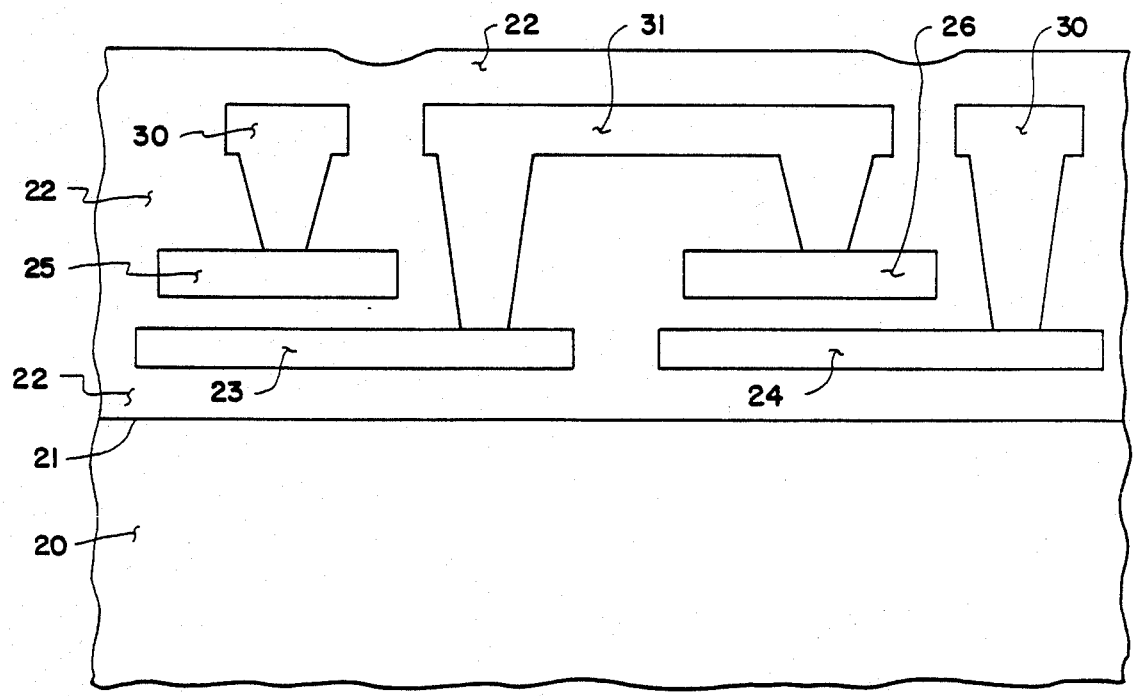

FIG. 3A shows a top view of the structure of FIG. 3B through which a section line, 27, was taken to provide the view of FIG. 3B. Again shown in FIG. 3A are a pair of terminating regions, 28 and 29, through which the composite capacitor is electrically interconnected with other circuit portions in the monolithic integrated circuit. Again note that no effort has been made to use dashed lines to show structures that are underneath portions of the insulating material. Common structures in FIGS. 3A an 3B have common designations in each. Because of the balancing of capacitance variation with applied voltage (as shown in FIG. 1 for one such underlying capacitor) of one underlying capacitor against the other, the variation in capacitance with applied voltage for the composite capacitor is less than that of either underlying capacitor alone.

The embodiments of the invention in which an exclusive property or right is claimed are defined as follows:

1. A digital to analog or analog to digital converter circuit wherein at least one capacitor is charged in response to an input voltage to be converted, said capacitor comprising:
   a body of semiconductor material of a first conductivity type except in selected portions, said body having a first major surface;
   a plurality of surface vicinity plates including first and second surface vicinity plates located relatively close to said first major surface each an electrical conductor and each electrically insulated from one another;
   a plurality of surface distal plates outside said body of semiconductor material including first and second surface distal plates located relatively farther from said first major surface than are said plurality of surface vicinity plates, each of said first and second surface distal plates being an electrical conductor and each electrically insulated from one another;
   a pair of insulating layer portions including first and second insulating layer portions each serving as electrical insulators with said first insulating layer portion separating said first surface vicinity plate from said first surface distal plate which are opposite oee another on opposite sides of said first insulating layer portion, and with said second insulating layer portion separating said second surface vicinity plate from said second surface distal plate which are opposite one another on opposite sides of said second insulating layer portion; and an electrical interconnection network at least a portion of which electrically connects said first surface vicinity plate to said second surface distal plate and serves as a first terminating region for said capacitor, and at least another portion of which electrically connects said second surface vicinity plate to said first surface distal plate and serves as a second terminating region for said capacitor, wherein said input voltage is selectively applied to said first terminating region and a reference voltage is selectively applied to said second terminating region.

2. The apparatus of claim 1 wherein said first and second surface vicinity plates are each constructed of doped polycrystalline silicon.

3. The apparatus of claim 1 wherein each of said first and second surface vicinity plates are constructed in said body of semiconductor material in selected portions thereof which are of a second conductivity type.

4. The apparatus of claim 1 wherein said first and second surface distal plates are each constructed of doped polycrystalline silicon.

5. The apparatus of claim 2 wherein said first and second surface distal plates are each constructed of doped polycrystalline silicon.

6. The apparatus of claim 3 wherein said first and secodd surface distal plates are each constructed of doped polycrystalline silicon.

7. The apparatus of claim 3 wherein each of said first and second surface distal plates are constructed of metal, said interconnection network portions and said terminating regions also being constructed of said metal.

8. The apparatus of claim 4 wherein said electrical interconnection network portions and said terminating regions are constructed of metal.

* * * * *